United States Patent [19]
Moon

[11] Patent Number: 6,078,030
[45] Date of Patent: Jun. 20, 2000

[54] COMPONENT HEATER FOR USE IN SEMICONDUCTOR MANUFACTURING EQUIPMENT

[75] Inventor: Roger A. Moon, Pflugerville, Tex.

[73] Assignee: Millipore Corporation

[21] Appl. No.: 09/150,458

[22] Filed: Sep. 9, 1998

[51] Int. Cl.[7] .................................................. H05B 3/02
[52] U.S. Cl. .......................................... 219/483; 219/494
[58] Field of Search .................................... 219/483, 494, 219/510; 394/126; 137/486, 487.5; 73/204

[56] References Cited

U.S. PATENT DOCUMENTS

| | | | |
|---|---|---|---|
| 4,436,674 | 3/1984 | McMenamin | 261/64 B |
| 4,484,472 | 11/1984 | Licinit et al. | 73/204 |
| 4,794,947 | 1/1989 | Kuramochi | 137/486 |
| 5,033,299 | 7/1991 | Tanaka et al. | 73/204.26 |
| 5,062,446 | 11/1991 | Anderson | 137/468 |
| 5,129,418 | 7/1992 | Shimomura et al. | 137/486 |
| 5,138,973 | 8/1992 | Davis et al. | 118/723 MP |
| 5,279,154 | 1/1994 | Vavra et al. | 73/202.5 |
| 5,373,737 | 12/1994 | Hwang | 73/204.22 |
| 5,436,172 | 7/1995 | Moslehi | 437/8 |
| 5,439,026 | 8/1995 | Moriya et al. | 137/486 |
| 5,441,076 | 8/1995 | Moriya et al. | 137/486 |
| 5,455,014 | 10/1995 | Costantino et al. | 422/305 |
| 5,601,366 | 2/1997 | Paranjpe | 374/126 |
| 5,660,207 | 8/1997 | Mudd | 137/599.1 |
| 5,911,238 | 6/1999 | Bump et al. | 137/487.5 |

*Primary Examiner*—Teresa Walberg
*Assistant Examiner*—Jeffrey Pwu
*Attorney, Agent, or Firm*—Gray Cary Ware & Friedenrich LLP

[57] ABSTRACT

A heating system and method used to maintain a fluid flowing through a component (such as a mass flow controller) within approximately a predetermined temperature range. The fluid flows through a cavity in the component. A heater element and a sensor are positioned within the body of the component and the heater element is coupled to a power source. The temperature sensor is electrically connected to a controller. The controller will receive an input indicative of the temperature, determine whether the input falls within a predetermined temperature range, and output a signal to the power source to adjust the power provided to the heater element as necessary in order to maintain the temperature within the predetermined temperature range.

19 Claims, 3 Drawing Sheets

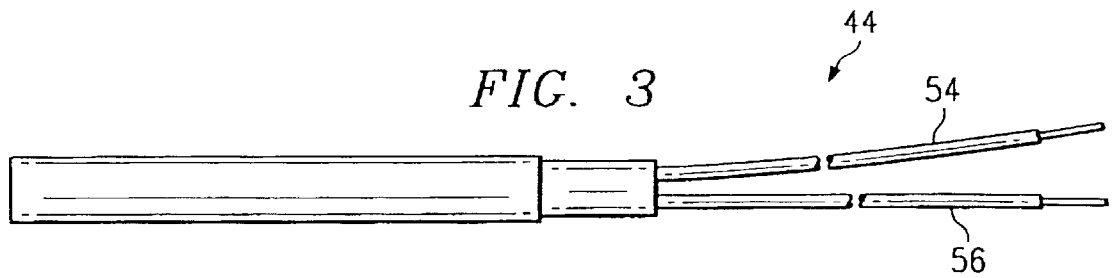
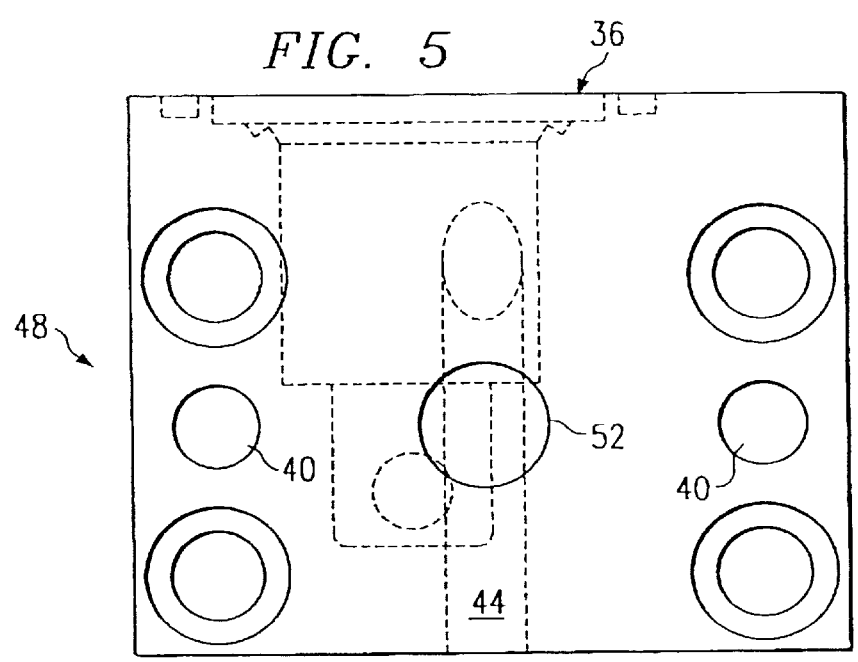

COMPONENT HEATER FOR USE IN SEMICONDUCTOR MANUFACTURING EQUIPMENT

TECHNICAL FIELD OF THE INVENTION

The present invention relates generally to electrical systems and methods, and more particularly, to a system aid method for heating various gas flow components in semiconductor manufacturing processes.

BACKGROUND OF THE INVENTION

Mass flow controllers are used to regulate the amount of the process gas that is introduced into a manufacturing system, for example a semiconductor manufacturing system. With reference to FIG. 1, the gas will flow from a source through a gas path 10, commonly referred to as a gas stick, that can include, as an example, a regulator 12, a manual valve 14, a pressure transducer or sensor 16, a filter 18, an air operated isolation valve 20, an air operated valve purge valve 24, a mass flow controller 22, and a downstream isolation air operated valve 26 to the process chamber. This is an exemplary manufacturing system and any number of additional and alternative components could comprise the gas path from the source to the process chamber.

Mass flow controller 22, and other components that transport the gas from the source to the process chamber, often require heating during operation so that the process gas flowing through the mass flow controller does not condense back into liquid form. The temperature to which the components must be heated during operation depends on various factors, including the type of gas being transported, but the gas should not be allowed to change to a liquid state due to the deleterious effects on the process and the components in the manufacturing system. The heating of the components in the gas path has long been recognized as a requirement to enable proper operation of the components and equipment in various manufacturing processes, including semiconductor manufacturing. However, existing methods for heating the components in the gas transport path have several limitations.

One conventional method of heating the mass flow controller and other components in the gas transport path involved placing a heating blanket on a portion of the mass flow controller and/or other components. For example, a heating blanket 28 could surround the mass flow controller and/or the enter gas stick, as indicated by the shaded areas in FIG. 1. Some heating blankets 28 comprise a silicon rubber material having wires running through the material that would heat up as electrical current traveled through the wires. The heat from the heating blanket is transferred to the main body 30 of the mass flow controller 22, and subsequently into the interior of the mass flow controller 22 in order to heat the gas to prevent it from transforming to a liquid state.

This conventional method of heating the components in the gas path 10 has several limitations. The heating blanket is not especially efficient due to inefficiencies of transferring heat from the heating wires in the heating blanket, to the main body of the component, to the internal flow path within the mass flow controller and finally to the gas flowing through the component. Additionally, this conventional heating blanket method is difficult to implement for top mount mass flow controllers due to space constraints and design limitations that prevent the blanket from being positioned around the entire body of the mass flow controller.

SUMMARY OF THE INVENTION

The present invention provides a heating system and method for use in a manufacturing system to maintain a fluid flowing through a component within a defined temperature range that substantially eliminates or reduces disadvantages and problems associated with previously developed fluid heating systems and methods.

More specifically, the present invention provides a system and method to maintain a fluid flowing through a component (such as a mass flow controller) within approximately a predetermined temperature range. The invention includes a heater element and a sensor positioned within the body of the component, where the heater element is coupled to a power source. The temperature sensor is electrically connected to a controller. The controller will receive an input indicative of the temperature, determine whether the input falls within a predetermined temperature range, and output a signal to the power source to adjust the power provided to the heater element as necessary in order to maintain the temperature within the predetermined temperature range.

The present invention provides an important technical advantage by allowing more precise control of the temperature of the gas flowing in a component in the gas path.

The present invention provides another technical advantage by providing more efficient heat transfer from the heat source to the gas flowing in the component transferring the gas.

The present invention provides another technical advantage because it can be installed in the component base, rather than on the outside of the component.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIG. 3 is one embodiment of a heater element according to the teachings of the present invention;

FIG. 5 shows a front view of the outlet portion of a mass flow controller incorporating an embodiment of the present invention.

DETAILED DESCRIPTION OF THE INVENTION

Preferred embodiments of the present invention are illustrated in the FIGUREs, like numerals being used to refer to like and corresponding parts of the various drawings.

The component and fluid heater system of the present invention can be used to heat the components (or pieces of equipment) through which a fluid (typically a gas) travels in a manufacturing process. The gas is heated in order to ensure it remains within a predetermined temperature range while flowing through the transport. components. For illustration purposes, the component discussed throughout this description will be a mass flow controller in a semiconductor manufacturing process, but it should be understood that the present invention applies as well to any other component in any manufacturing process having a fluid flow where the fluid needs to be maintained within a certain temperature window. The present invention can be used to heat the mass flow controller and other components in the gas transport path, to sense the temperature of the gas or the component, and to control the level of heating via a controller (which can be a multizone controller). In a semiconductor manufacturing process, the gas is maintained within this temperature range so that, among other reasons, the gas will not change state to a liquid while traveling through the gas transport path.

Figure 2:
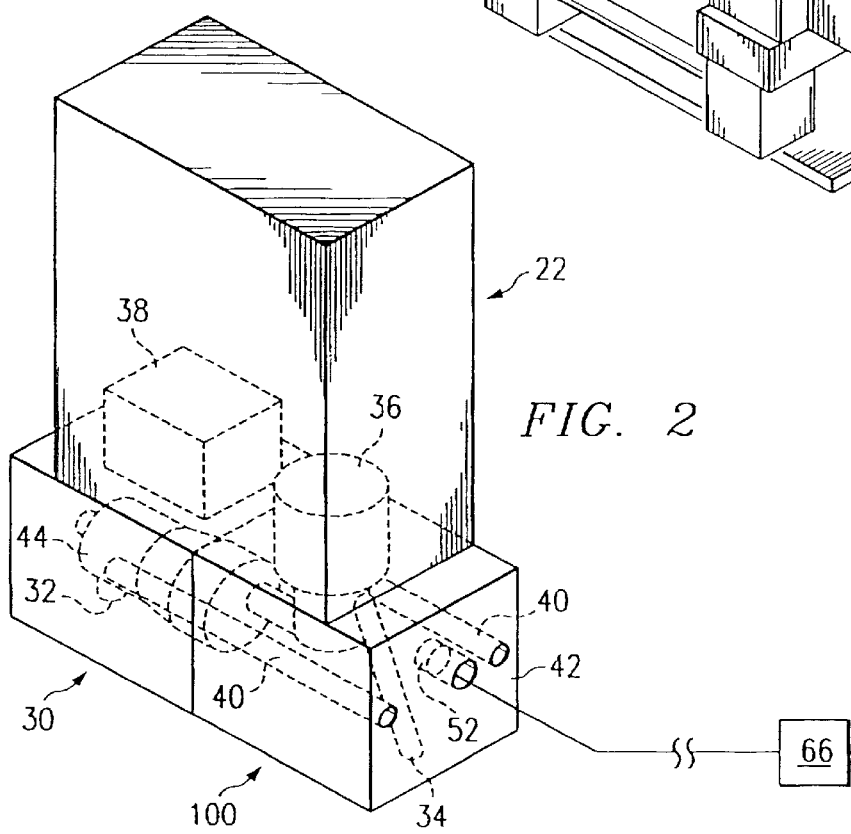
FIG. 2 shows an embodiment of the present invention within a mass flow controller.

FIG. 2 shows one embodiment of the component heater 100 of the present invention installed in a mass flow controller 22. The mass flow controller 22 includes a main body 30 having inlet 32 and outlet 34 at the opposite ends of the mass flow controller 22. A flow sensor devise 38 is mounted on the main body 30 at a position near the inlet 32, while a gas flow rate valve 36 is mounted on the main body 30 at a position near the outlet 34 (as shown in FIG. 2). The main body 30 is a solid material, typically a metal, the includes a cavity 44 through which the gas flows within the main body 30. During operation of a mass flow controller 22, a gas will flow into inlet 32, through cavity 44, and out through the outlet 34. A portion of the gas will be diverted to an inlet tube of the flow sensor device 38 in order to measure the rate of gas flow through the mass flow controller 22. The valve 36 operates to increase or decrease the rate of gas flow through the mass flow controller 22 during operation.

In the embodiment of FIG. 2, the component heater 100 of the present invention includes two cylindrical heater elements 40 installed in the mass flow controller through holes in the main body 30 proximate the outlet 34. The holes are drilled into the main body 30 from the face 42 to an appropriate depth into the solid material of main body 30. The size and shape of the hole will depend on the type of heater element used. In embodiment of FIG. 2, the heater elements 40 are shown as extending through most of the length of the mass flow controller. The heater elements may reside within the solid material of the main body 30 at a variety of positions, and can be of various shape, and sizes as long as the integrity of the cavity 44 is maintained.

The heater elements 40 can be coupled within the mass flow controller 22 a variety of ways, including a press fit. Also, the holes can be drilled slightly larger than the heater elements and an epoxy can be used to hold the heater elements 40 in place. The heater elements 40 can be cartridge heaters, such as those manufactured by Watlow FIREROD cartridge heaters. FIG. 3 shows one embodiment of a heater element 44 that can be used in conjunction with the present invention. The heater element 40 includes an internal element coupled between an input lead 54 and an output lead 56. The internal element can be resistance winding. Electricity sent into the heater element 40 via the input. lead 42 to the internal element causes the internal element, and therefore the entire heater element 40 to increase in temperature according to the amount of electricity supplied, the type of internal element used, and the material used to form the body of the heater element 40. The heater elements 40, when installed within the mass flow controller 22, are then able to transfer heat to the main body 30 which heats the gas flowing through the mass flow controller 22. Heater elements 40 need to supply a sufficient amount of heat to prevent the gas flowing through the mass flow controller from condensing. For use in a typical mass flow controller application, the heater elements could have a wattage ranging from ten to 100 watts provided by either AC or DC current source.

In the embodiment of FIG. 2, a sensor 52 is installed within the main body 30 proximate the cavity 44. In an alternative embodiment, sensors 52 could be installed directly on each heating element 40. Sensor 52 is coupled to a controller 66 through an electrical connection. Sensor 52 measures the temperature at the sensor 52 location and sends the temperature information to controller 66. Controller 66 receives the temperature information from the sensors 52, processes the information, and adjusts the flow of electricity to the heating elements 40 based on whether the temperature at the sensor 52 is within, above or below a predetermined temperature range. The predetermined temperature range can be any range that can be maintained given the type and number of heating elements 40 placed within the mass flow controller 22. As an example, semiconductor manufacturing process gas $BCL_3$ needs to be maintained between 40 and 70 degrees Celsius when flowing through the mass flow controller 22 in order to ensure proper operation at the process chamber. The predetermined temperature range could be set to a tighter tolerance, for example, 55–60 degrees Celsius, so that whenever the temperature fell below 55 degrees the heater element was turned on or power was increased to the heater element, and if the temperature rose above 60 degrees the heater element was turned off or the power was reduced. Sensor 52 can be an resistive thermal device (RTD) or a thermocouple sensor or any other sensor suitable to provide temperature feedback to controller 66. The sensors 52 can be positioned within the mass flow controller at a variety of places, but will provide a more accurate gas temperature reading when positioned more closely to cavity 44. Alternatively, the sensor 52 could be placed more closely to heater element 40 to more closely monitor the heating element 40 temperature. In another embodiment, sensor 52 and heating element 40 could comprise a single unit. It should be understood that multiple sensors 52 could be used with the present invention.

Figure 1:
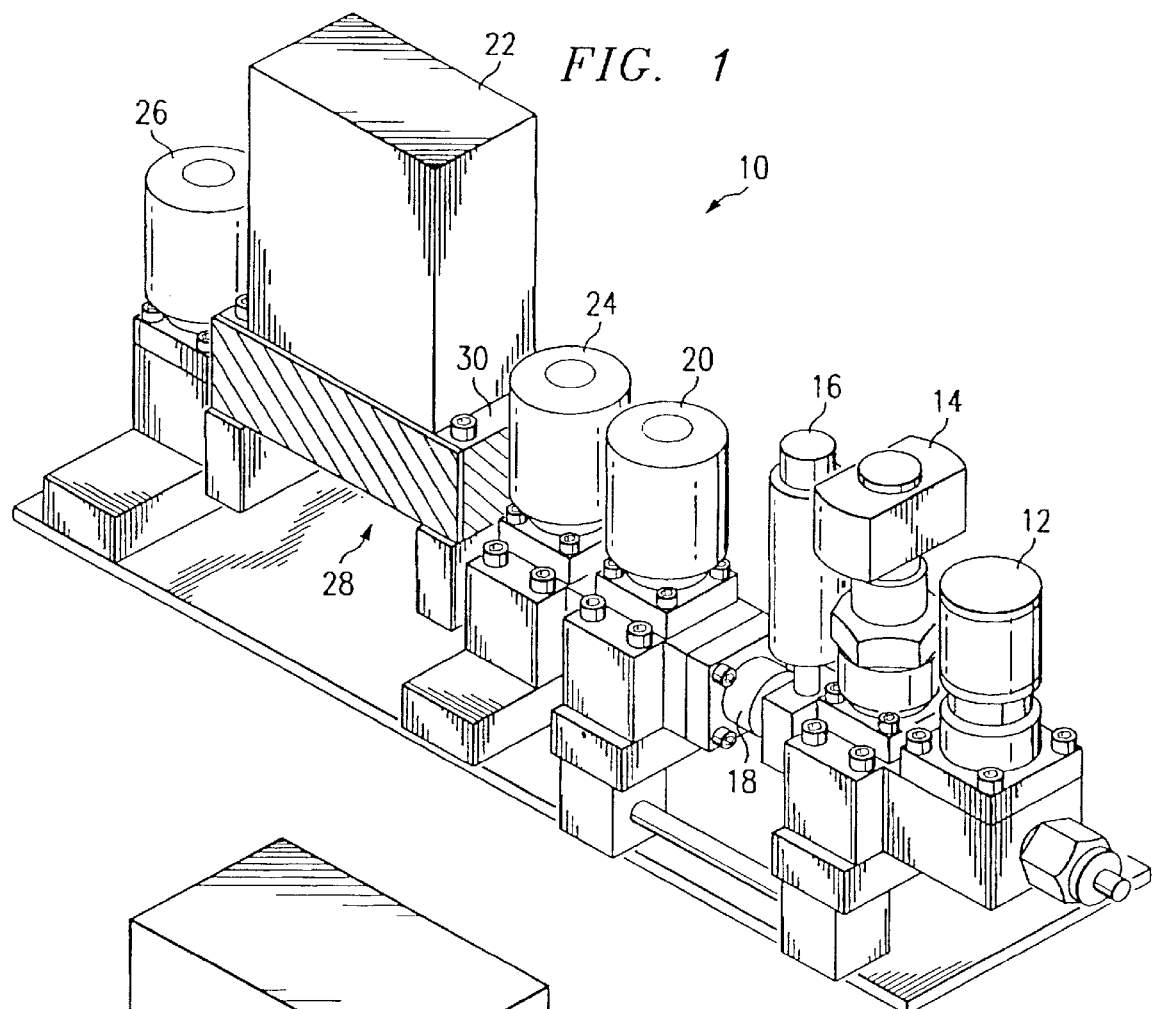
FIG. 1 shows an exemplary gas path, or gas stick, used to flow gas from a source to a process chamber in a semiconductor manufacturing process.

Controller 66 can include a multizone controller for independently controlling different zones. For example, a multizone controller 66 could provide independent temperature control for each individual heater element 40, or for groups of heater elements 40, within a single component such as a mass flow controller. In an alternative embodiment, a multizone controller 66 could provide independent control over zones covering multiple components. For example, gas stick of FIG. 1 could be divided into four zones, where zone 1 includes the regulator 12, manual valve 14, and pressure transducer, zone 2 includes filter 18, air operated isolation valve 20, and air operated valve purge valve 24, zone 3 includes the mass flow controller 22 and zone 4 includes downstream isolation air operated valve 26. The multizone controller 66 can receive input from temperature sensors 52 contained within each zone (or from within each component within each zone) and control each zone independently from every other zone. Furthermore, the multiple zones could exist within a single component. For example, the mass flow controller 22 of FIG. 2 could be divided into two zones with each zone containing one of the heater elements 40. The multizone controller could control the first heater element 40 by adjusting the power to the first heater element 40 independently of the second heater element 40 based on the input from the sensor 52 Furthermore, multiple sensors 52 could be placed on or in relatively close proximity to the heater elements 40 and again each heater element 40 could be controlled independently of the other heater element 40 based on the input from the multiple sensors 52.

Figure 4:
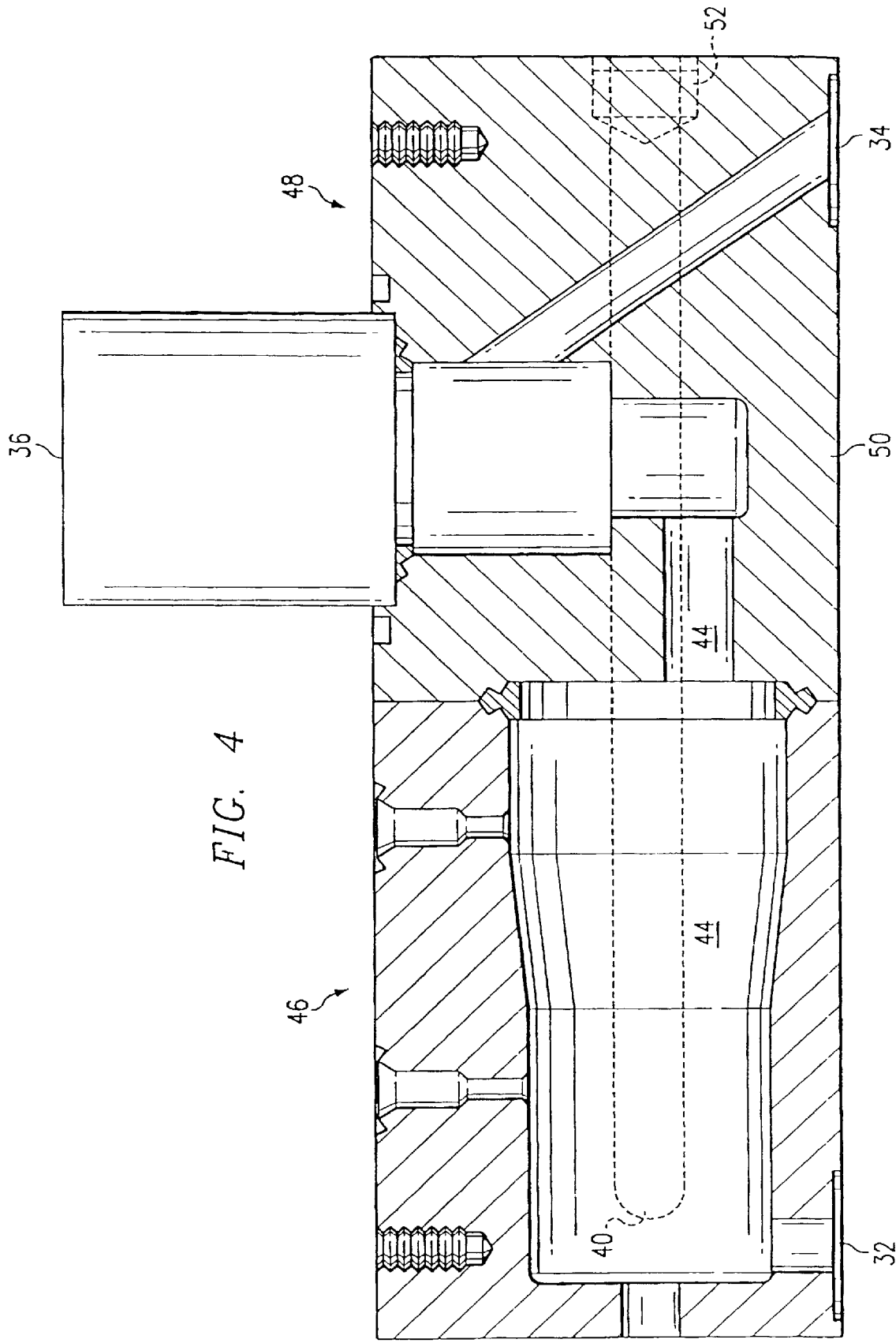
FIG. 4 shows a side view of a mass flow controller including an embodiment of the present invention.

FIG. 4 shows a side view of the main body 30 of the mass flow controller 22 of FIG. 2 that includes an inlet portion 46, an outlet portion 48, and a cavity 44. As shown in FIG. 4, the heater elements 40 and sensor 52 reside in the bypass area 50 of mass flow controller 22. In this manner, the heater elements 40 are placed within the mass flow controller 22 without disturbing the integrity of the cavity 44 within the mass flow controller 22. In alternative embodiments, the heater elements 40 could reside solely within the inlet portion 46 of the mass flow controller 22 or could extend through both the inlet portion 46 and any part of the outlet portion 48 of the mass flow controller 22.

FIG. 5 shows a front view of outlet portion 48 of the mass flow controller 22 including the FIG. 2 embodiment of the present invention. Two heater elements 40 are placed on opposite sides of the valve 36 in order to preserve cavity 44. The heater elements 40 are placed in two heater element cavities that can be drilled out of the body of the outlet portion of the mass flow controller. The heater elements 40 can be held within these heater element cavities via a press fit. The sensor 52 is inserted between the heater elements 40 near the cavity 44 without disturbing the integrity of the cavity 44. It should be understood that either t.he sensor 52 or heater elements 40 could reside partially or totally within the cavity 44 if the integrity of the cavity 44 (i.e., to prevent gas leaks) could be maintained and the flow within the cavity 44 remained acceptable.

It should be understood that the number of sensors, number of heating elements, the positioning of the heating elements, the shape of the heating elements, and the heat output capabilities of the heating elements are exemplary and can vary. For example, in an alternative embodiment, the present invention can include a single non-cylindrical heating element placed in the interior of the mass flow controller from a hole drilled proximate the inlet. In all embodiments, the present invention includes at least one heating element that can be introduced within the main body of the mass flow controller (or other component), in combination with sensing and controlling devices, in order to provide heating to the mass flow controller so that the gas flowing through the mass flow controller remains within a predetermined temperature range. It should be further understood that the present invention envisions deviations from an absolute temperature range that still qualify as maintained within a predetermined temperature range. For example, if the predetermined temperature range is from 50 to 70 degrees Celsius, and the controller is programmed to only provide additional power to the heater element when the sensor provides an input of 50 is degrees C. or less, a first input from the temperature sensor might indicate that the temperature is 50.1 degrees Celsius. The next input from the temperature sensor might indicate the temperature is 49.9 degrees Celsius and the controller would send a signal to the power source to provide an additional amount of electricity to the heater element in order to get the temperature within the 50–70 degree Celsius predetermined range. The controller will continue to increase the amount of electricity to the heater until the temperature sensor returns a signal at 50 degrees Celsius or higher. However, it is within the scope of the invention that the temperature went outside of the predetermined temperature range. This example illustrates where the temperature was maintained within a predetermined temperature range. The present invention provides the improved heater capability to bring the invention back into the predetermined temperature range.

The heating system of the present invention maintains a gas in a mass flow controller flowing in a semiconductor manufacturing in a gaseous state when it arrives at the process chamber. The present invention also provides the ability to more uniformly heat the gas because the heater elements are positioned within the body of the mass flow controller.

Although the present invention has been described in detail, it should be understood that various changes, substitutions and alterations can be made hereto without departing from the spirit and scope of the invention as described by the appended claims.

What is claimed is:

1. A heater system with temperature feedback for use in a manufacturing process to maintain a fluid within approximately a predetermined temperature range, comprising:
    a component having a body with a cavity, wherein the fluid flows through the cavity;
    a heater element positioned within the component and coupled to a power source;
    a temperature sensor positioned within the body of the component;
    a controller electrically coupled to the temperature sensor to receive an input from the temperature sensor, determine whether the input falls within a predetermined temperature range, and to output a signal to the power source to adjust the power provided to the heater element from the power source in order to maintain the temperature of the fluid within the predetermined temperature range; and
    wherein the heater element is placed within a heater element cavity within the body of the component.

2. The system of claim 1, wherein the heater element and the temperature sensor comprise a single device.

3. The system of claim 1, further comprising:
    a plurality of heater elements placed proximate the cavity; and
    a plurality of temperature sensors.

4. The system of claim 1, wherein the sensor is positioned proximate the cavity.

5. The system of claim 1, wherein the heater element is held within the component using a press fit.

6. The system of claim 1, wherein power source is an AC power source for providing power to the heater element.

7. The system of claim 1, wherein the heater element extends through substantially the entire body generally along an axis of fluid flow.

8. The system of claim 1, wherein the component is a mass flow controller, the fluid is $BCL_3$ in a gaseous state, the manufacturing process is a semiconductor manufacturing process, and the predetermined temperature range is from 40 degrees Celsius to 70 degrees Celsius.

9. The system of claim 1, wherein the component is a mass flow controller within a gas flow paths, and further wherein the heater element operates to increase a temperature within the mass flow controller.

10. The system of claim 1, wherein the component comprising a plurality of zones and further wherein the controller is a multizone controller for individually controlling each zone within the component to maintain the multiple zones within the component within the predetermined temperature range.

11. The system of claim 1, wherein the sensor is positioned partially within cavity without violating the integrity of the cavity.

12. A heater system for use in a semiconductor process to maintain a gas within a predetermined temperature range as the gas is flowing through a mass flow controller having a body with a cavity, comprising:
    a heater element positioned within the main body of the mass flow controller;
    a power source coupled to the heater element;
    a temperature sensor positioned proximate the cavity for detecting a temperature of the gas;

a controller for receiving a detected temperature as an input from the temperature sensor, determining whether the detected temperature falls within a predetermined temperature range, and to output a signal to the power source to adjust the power provided to the heater element from the power source in order to maintain the detected temperature of the gas in the cavity within the predetermined temperature range; and wherein the mass flow controller comprises a plurality of zones and further wherein the controller is a multizone controller for individually controlling each zone within the mass flow controller to maintain each of the zones within the mass flow controller within the predetermined temperature range.

13. The system of claim 12, further comprising:

a plurality of heater elements placed proximate the cavity; and a plurality of sensors, at least one sensor placed proximate each heater elements.

14. The system of claim 13, wherein the each heater element extends through substantially the entire body generally along an axis of fluid flow.

15. A method for heating a fluid in a manufacturing process in order to keep the fluid within a predetermined temperature range, comprising:

flowing the fluid through a cavity within a component;

positioning a heater element within the component;

providing power to the heater element from a power source to generate heat;

detecting a temperature from a temperature sensor positioned within the component;

receiving a signal representative of the temperature of from the temperature sensor at a controller; and adjusting the power provided to the heater element in order to maintain the temperature of the fluid within the predetermined temperature range.

16. The method of claim 15, further comprising positioning the temperature sensor proximate the heater element.

17. The method of claim 15, further comprising positioning the temperature sensor proximate the cavity.

18. The method of claim 15, further comprising positioning a plurality of heater elements within the component.

19. The method of claim 18, further comprising providing power to each heater element independently.

* * * * *